(12) United States Patent
Durukan et al.

(10) Patent No.: US 9,914,632 B2
(45) Date of Patent: Mar. 13, 2018

(54) METHODS AND APPARATUS FOR LIQUID CHEMICAL DELIVERY

(71) Applicant: APPLIED MATERIALS, INC., Santa Clara, CA (US)

(72) Inventors: Ilker Durukan, Sunnyvale, CA (US); Muhammad M. Rasheed, San Jose, CA (US); Paul F. Ma, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 108 days.

(21) Appl. No.: 14/522,142

(22) Filed: Oct. 23, 2014

(65) Prior Publication Data

US 2016/0052772 A1    Feb. 25, 2016

Related U.S. Application Data

(60) Provisional application No. 62/040,843, filed on Aug. 22, 2014.

(51) Int. Cl.
*B67D 7/02* (2010.01)
*C23C 16/448* (2006.01)
*B67D 7/36* (2010.01)
*C23C 16/44* (2006.01)

(52) U.S. Cl.
CPC .......... *B67D 7/0272* (2013.01); *B67D 7/362* (2013.01); *C23C 16/4482* (2013.01); *C23C 16/4409* (2013.01)

(58) Field of Classification Search
CPC .... B67D 7/0272; B67D 7/22; C23C 16/4409; C23C 16/4482; Y10T 428/13
See application file for complete search history.

(56) References Cited

U.S. PATENT DOCUMENTS

| 4,563,312 A | * | 1/1986 | Takimoto | B01J 4/008 137/239 |
| 5,568,882 A | * | 10/1996 | Takacs | G01F 23/168 222/155 |
| 5,749,500 A | * | 5/1998 | Kraus | B65D 25/02 222/377 |
| 5,776,255 A | * | 7/1998 | Asaba | C23C 16/045 118/726 |
| 6,077,356 A | * | 6/2000 | Bouchard | B01J 4/008 118/715 |
| 6,220,091 B1 | * | 4/2001 | Chen | C23C 16/4482 438/14 |
| 6,648,174 B2 | * | 11/2003 | Greene | B67D 1/00 222/146.6 |

(Continued)

*Primary Examiner* — Paul R Durand
*Assistant Examiner* — Bob Zadeh
(74) *Attorney, Agent, or Firm* — Moser Taboada; Alan Taboada

(57) ABSTRACT

Methods and apparatus for delivering precursor materials derived from liquid chemicals to a process chamber are provided herein. In some embodiments, a liquid chemical delivery apparatus includes: a body having an inner volume to hold a liquid chemical, an inlet to receive a carrier gas into the inner volume, and an outlet to flow the carrier gas from the inner volume, wherein a bottom of the inner volume includes a reduced volume portion; and a level sensor configured to detect a level of the liquid chemical in the reduced volume portion.

16 Claims, 3 Drawing Sheets

(56) References Cited

U.S. PATENT DOCUMENTS

| | | | |
|---|---|---|---|
| 7,464,917 B2 * | 12/2008 | Lee | C23C 16/4482 261/121.1 |
| 2003/0116019 A1 * | 6/2003 | Torkaman | B01F 3/022 95/226 |
| 2008/0014350 A1 * | 1/2008 | Carlson | C23C 16/4482 427/255.21 |
| 2008/0178809 A1 * | 7/2008 | Spohn | C23C 16/4409 118/726 |
| 2008/0179767 A1 * | 7/2008 | Spohn | C23C 16/4409 261/135 |
| 2009/0114157 A1 * | 5/2009 | Lee | C23C 16/4482 118/726 |
| 2012/0018037 A1 * | 1/2012 | Nakagawa | C23C 16/4482 141/67 |
| 2013/0340678 A1 * | 12/2013 | Wamura | C23C 16/455 118/712 |
| 2016/0052772 A1 * | 2/2016 | Durukan | B67D 7/0272 222/1 |

* cited by examiner

METHODS AND APPARATUS FOR LIQUID CHEMICAL DELIVERY

CROSS-REFERENCE TO RELATED APPLICATIONS

This application claims benefit of U.S. provisional patent application Ser. No. 62/040,843, filed Aug. 22, 2014, which is herein incorporated by reference in its entirety.

FIELD

Embodiments of the present disclosure generally relate to semiconductor fabrication and, more particularly, to liquid chemical delivery in semiconductor fabrication processes.

BACKGROUND

Some chemicals used in, for example, semiconductor device processing or other thin film fabrication processes, are delivered into a process chamber using a liquid containing ampoule. Such ampoules typically include a canister that is in fluid communication with an inlet port and an outlet port using a carrier gas that is fed through the ampoule. For example, the carrier gas is fed into the liquid using a bubbler tube, saturates the fluid, and carries away some of the liquid. As another example, the carrier gas is fed into a space above the liquid, may flow over the liquid, and carries away vapor from the space above the liquid. The ampoule may be used until all liquid is removed, at which time the ampoule is refilled or replaced. Alternatively, the ampoule may be refilled periodically based on measurements taken using an in situ level sensor. A refill tank is employed to hold chemicals for refilling the ampoule and typically has a much larger volume than the ampoule to enable the ampoule to be repeatedly refilled. However, the inventors have observed that the ampoule is typically refilled before the liquid is completely depleted, thus wasting an unused volume of liquid at the bottom of the ampoule. Therefore, the inventors believe that it would be advantageous to minimize the unused volume of liquid because the chemicals are expensive.

Accordingly, the inventors have provided improved apparatus for measuring the level of a liquid to be provided in a substrate process.

SUMMARY

Methods and apparatus for delivering precursor materials derived from liquid chemicals to a process chamber are provided herein. In some embodiments, a liquid chemical delivery apparatus includes: a body having an inner volume to hold a liquid chemical, an inlet to receive a carrier gas into the inner volume, and an outlet to flow the carrier gas from the inner volume, wherein a bottom of the inner volume includes a reduced volume portion; and a level sensor configured to detect a level of the liquid chemical in the reduced volume portion.

In some embodiments, a liquid chemical delivery apparatus includes: a body having an inner volume to hold a liquid chemical, wherein the inner volume includes a reduced volume portion disposed at a bottom of the inner volume; an inlet disposed in the body to provide a carrier gas to the inner volume; an outlet disposed in the body to flow the carrier gas from the inner volume; an inlet tube fluidly coupled to the inner volume to provide the liquid chemical to the inner volume; a liquid input valve coupled to the inlet tube to control opening and closing of the inlet tube; and a level sensor configured to sense a level of the liquid chemical in the reduced volume portion.

In some embodiments, a liquid chemical delivery apparatus includes: a body having an inner volume to hold a liquid chemical, wherein the inner volume includes a reduced volume portion disposed at a bottom of the inner volume; an outlet fluidly coupled to an upper portion of the inner volume, outside of the reduced volume portion, to flow a mixture of a carrier gas and a precursor derived from the liquid chemical; and a level sensor disposed in the reduced volume portion to sense a level of the liquid chemical.

In some embodiments, a method of delivering a liquid chemical to a process chamber includes: providing a liquid chemical to a body of a liquid chemical delivery apparatus, wherein the body includes an inner volume to hold the liquid chemical, and wherein the inner volume includes a reduced volume portion disposed at a bottom of the inner volume; flowing a carrier gas through the inner volume to create a mixture of the carrier gas and a vapor of the liquid chemical; and sensing a level of the liquid chemical in the reduced volume portion using a level sensor to detect a low level of the liquid chemical.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
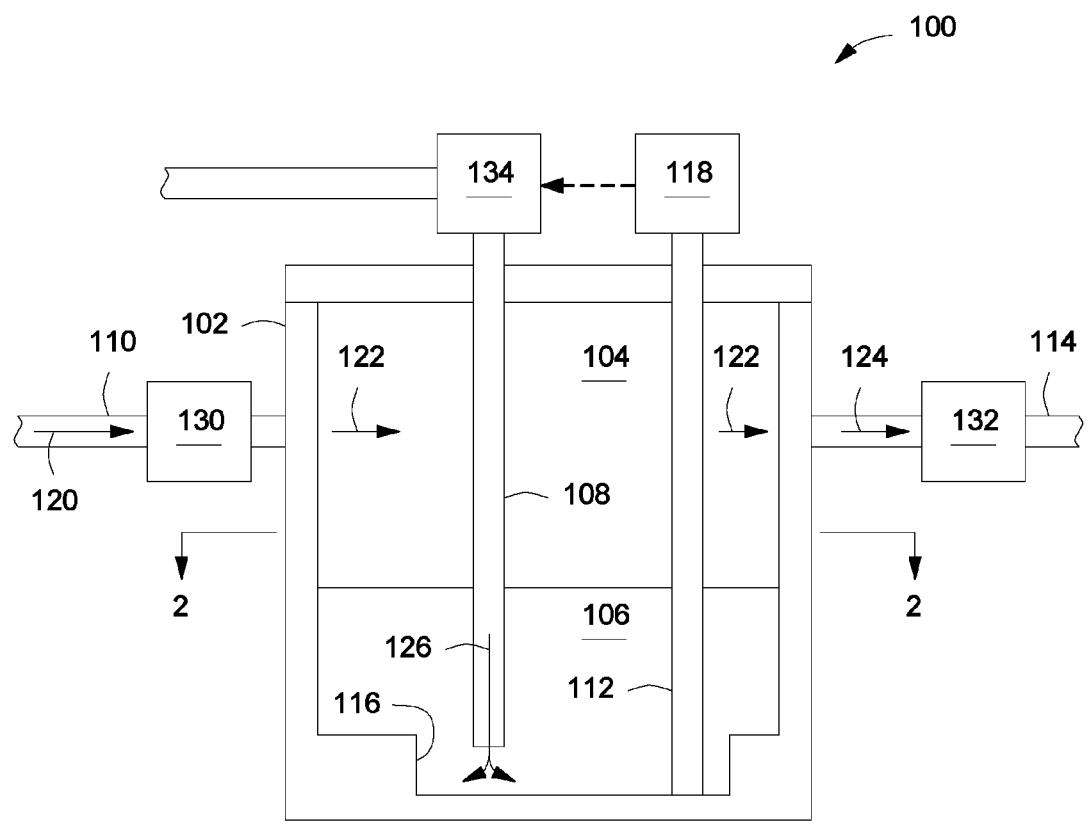
FIG. 1 is a schematic view of an example of a chemical delivery apparatus in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present disclosure relate to methods and apparatus for delivering precursor materials derived from liquid chemicals to a process chamber, such as a substrate process chamber for processing semiconductor or other substrates used in microelectronic fabrication. Embodiments of the present disclosure may advantageously facilitate determining a level of a liquid chemical disposed in a container, such as an ampoule, at a lower level than in conventional ampoules. Determining the level of the liquid chemical with less liquid chemical remaining in the ampoule advantageously saves wasted amounts of the liquid chemical that may remain in the ampoule after a low level alarm is triggered.

FIG. 1 is a schematic diagram showing a chemical delivery apparatus 100 (e.g., an ampoule) according to some embodiments of the present disclosure. The chemical delivery apparatus 100 includes a body 102 having an inner volume 104 (or reservoir) which holds a liquid 106, such as a liquid chemical precursor to be delivered to a process chamber. The body includes an inlet and an outlet to flow a carrier gas through the body 102. In some embodiments, a gas inlet conduit 110 may be coupled to the inlet and a gas outlet conduit 114 may be coupled to the outlet. The gas inlet conduit 110 may include an inlet valve 130 to selectively open or close the inner volume 104 to the carrier gas. The gas outlet conduit 114 may include an outlet valve 132 to selectively open or close the inner volume 104 to the process chamber or other downstream components. For example, the inlet valve 130 and the outlet valve 132 may be opened to flow a carrier gas through the body 102.

The carrier gas is used to carry a precursor derived from the liquid chemical to a process chamber downstream of the chemical delivery apparatus 100. The precursor derived from the liquid chemical may be, for example, a vapor of the liquid chemical, entrained droplets of the liquid chemical, or combinations thereof. In some embodiments, the carrier gas may flow along a path 120 into a space above the liquid 106 to carry a vapor which has evaporated from the liquid 106. In some embodiments, the carrier gas may flow along a path above and outside of the inner volume to draw the vapor out of the inner volume 104, in such embodiments, the gas inlet conduit 110 and the gas outlet conduit 114 may be combined and coupled to the inner volume 104 at a single point such that flow of the gas creates a pressure differential that draws the vapor out of the inner volume 104 and into the gas stream flowing in the conduit. In some embodiments, the carrier gas may flow through the liquid 106 (e.g., the carrier gas may be bubbled through the liquid) to collect the vapor evaporated from the liquid 106. The carrier gas carrying the vapor then exits the body 102 along, for example, path 124 through the gas outlet conduit 114 and outlet valve 132. In some embodiments, the carrier gas travels along, for example, cross-flow path 122 and collects vapor along the cross-flow path before exiting along path 124.

A level sensor 112 is provided to detect the level of the liquid 106 in the body 102 and to determine, for example, when the detected level of the liquid 106 indicates that the body 102 is empty, nearly empty, or at some other predetermined level. The level sensor 112 may be coupled to a controller 118, which outputs signals to control a liquid input valve 134 based on the detected liquid level. The controller 118 controls the liquid input valve 134 to deliver liquid along an inlet tube 108 into the inner volume 104 along, for example, path 126 to maintain a desired liquid level in the body 102 (e.g., such as a constant level, or a level within a predetermined range such as by periodic refilling of the inner volume).

The inner volume 104 of the body 102 includes a reduced volume portion 116, into which the level sensor 112 extends. The reduced volume portion 116 shown in FIG. 1 is a recess with a smaller cross-sectional area than that of the remaining portion of the inner volume 104. However, the reduced volume portion 116 may achieved in other ways, such as, for example, tapering sidewalls of the body that define the inner volume (e.g., as described below with respect to FIG. 3), or the like. By setting the predetermined level to a level within the reduced volume portion 116, an unused volume of the liquid 106 at an approximately planar bottom of the inner volume 104 is advantageously minimized. For example, the inner volume 104 may be sized to contain at least one liter (1,000 cubic centimeters) of liquid. In some embodiments, the reduced volume portion 116 may have a volume less than or equal to 30 cubic centimeters (cc) (as compared to an equivalent volume of at least about 164 cc in an ampoule having the same dimensions but without the reduced volume portion). In some embodiments, the level sensor 112 and the reduced volume portion 116 are configured such that the amount of liquid 106 remaining upon detection of low level by the level sensor 112 is less than or equal to 30 cc. In some embodiments, the level sensor 112 and the reduced volume portion 116 are configured such that the amount of liquid 106 remaining upon detection of low level by the level sensor 112 is less than or equal to about 20 percent of the liquid level that would be remaining in a similarly dimensioned apparatus not having a reduced volume portion.

Figure 2:
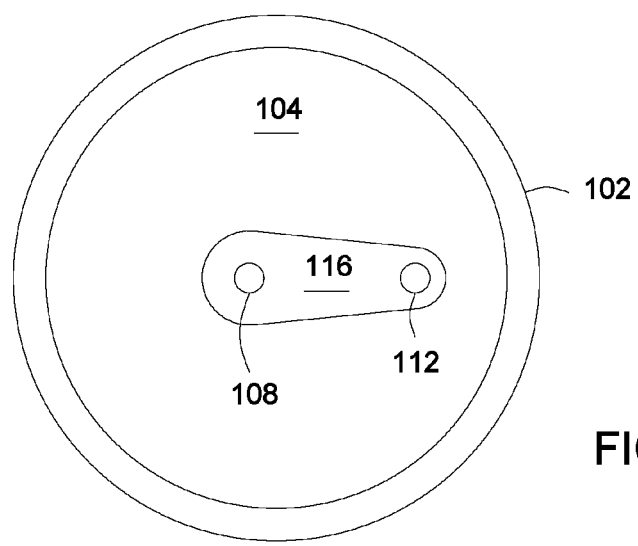
FIG. 2 is a sectional view of the chemical delivery apparatus of FIG. 1 in accordance with some embodiments of the present disclosure.

FIG. 2 is a sectional view of the chemical delivery apparatus 100 along sectional line 2-2'. Although the reduced volume portion 116 illustrated in FIG. 2 has an oblong shape, the reduced volume portion 116 may have any shape, for example, circular, rectangular, other polygonal shapes, etc.

Figure 3:
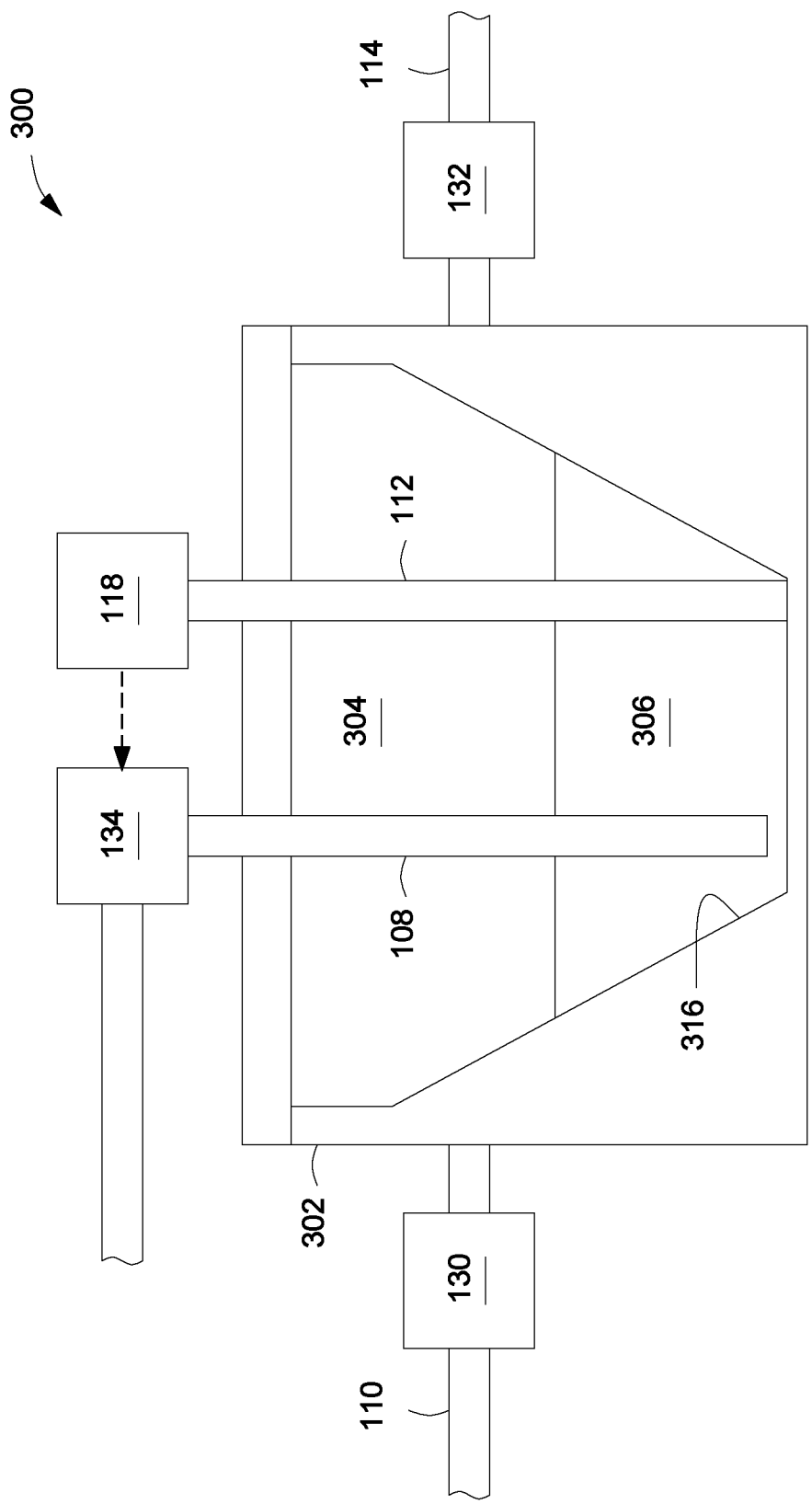
FIG. 3 is a schematic view of an example of a chemical delivery apparatus in accordance with some embodiments of the present disclosure.

FIG. 3 depicts a chemical delivery apparatus 300 according to some embodiments of the present disclosure. Similar to the chemical delivery apparatus 100, the chemical delivery apparatus 300 includes a body 302 with an inner volume 304 (or reservoir) that holds a liquid 306 and having a reduced volume portion 316 at an approximately planar bottom of the inner volume 304. However, as shown in FIG. 3, the reduced volume portion 316 is defined by a tapered lower portion of a sidewall of the body 302 that defines the inner volume 304. Although the tapered lower portion in FIG. 3 is at the center of the body 302, the tapered lower portion may alternatively be positioned at either side of the body 302 or at any other position along the bottom of the body 302.

Figure 4:
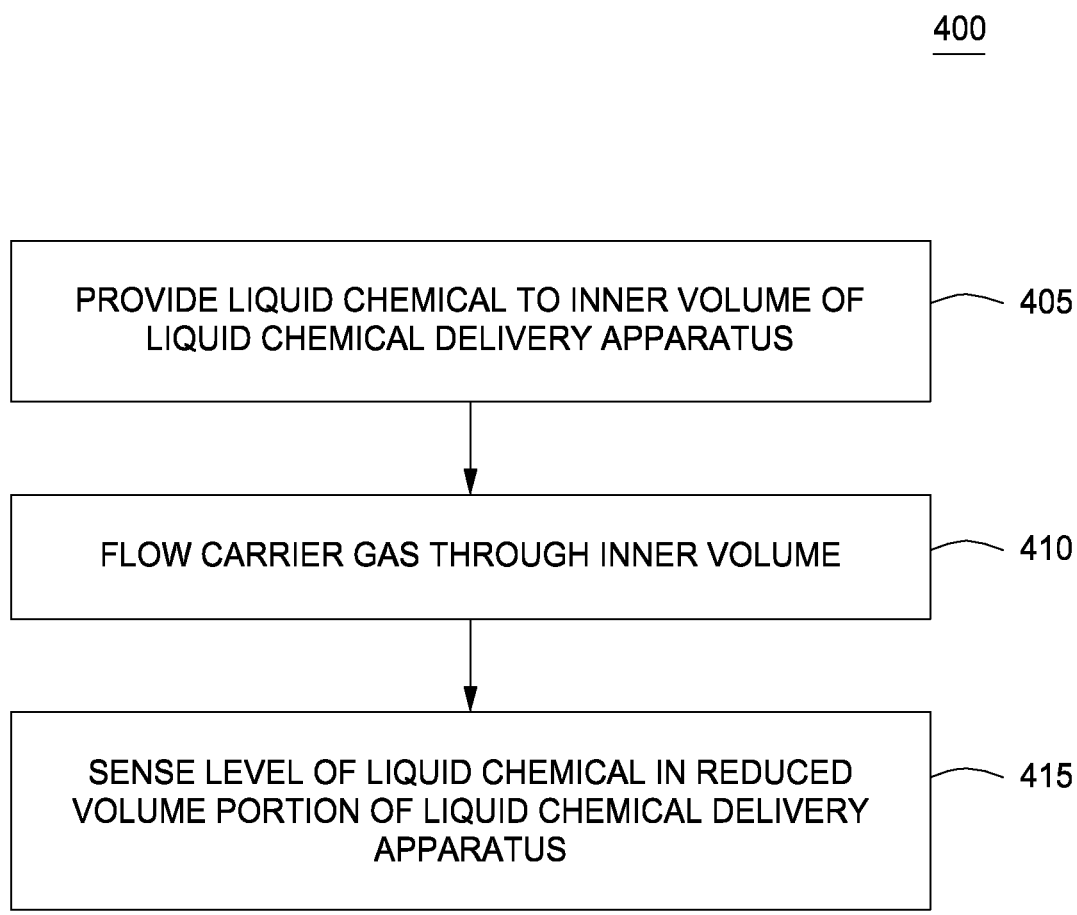
FIG. 4 depicts a flowchart of a method for delivering a liquid chemical to a process chamber in accordance with some embodiments of the present disclosure.

FIG. 4 depicts a method 400 of delivering a liquid chemical to process chamber. At 405, the liquid chemical is provided to an inner volume of a liquid chemical delivery apparatus. The inner volume includes a reduced volume portion disposed at a bottom of the inner volume. At 410, a carrier gas is flowed through the inner volume to create a mixture of the carrier gas and a vapor of the liquid chemical. At 415, a level sensor senses the level of the liquid chemical in the reduced volume portion to detect a low level of the liquid chemical.

While the foregoing is directed to embodiments of the present disclosure, other and further embodiments of the disclosure may be devised without departing from the basic scope thereof.

The invention claimed is:

1. A liquid chemical delivery apparatus, comprising:
a body having an inner volume to hold a liquid chemical, an inlet disposed in the body above the liquid chemical to receive a carrier gas into the inner volume such that the carrier gas is capable of interacting with a precursor derived from the liquid chemical, and an outlet disposed in the body above the liquid chemical to flow the carrier gas and at least a portion of the precursor from the inner volume, wherein a planar bottom of the inner volume includes a reduced volume portion, and wherein an inlet tube is fluidly coupled to the inner volume to provide the liquid chemical, the inlet tube passing through an upper portion of the inner volume and extending to the reduced volume portion; and a level sensor configured to detect a level of the liquid chemical in the reduced volume portion, wherein the reduced volume portion is defined by a wall which linearly tapers from a vertically oriented portion of an upper portion of the inner volume to the planar bottom of the inner volume.

2. The liquid chemical delivery apparatus of claim 1, wherein the reduced volume portion is centered within the body.

3. The liquid chemical delivery apparatus of claim 1, wherein the reduced volume portion is offset to a side of the body.

4. The liquid chemical delivery apparatus of claim 1, further comprising:
a liquid input valve coupled to the inlet tube to selectively open or close the inlet tube.

5. The liquid chemical delivery apparatus of claim 4, wherein the inlet tube has an end disposed in the reduced volume portion above the bottom.

6. The liquid chemical delivery apparatus of claim 1, wherein the reduced volume portion has a volume less than or equal to 30 cubic centimeters.

7. The liquid chemical delivery apparatus of claim 1, wherein the level sensor is disposed in the reduced volume portion.

8. A liquid chemical delivery apparatus, comprising:
a body having an inner volume to hold a liquid chemical, wherein the inner volume includes a reduced volume portion disposed at a bottom of the inner volume;
an inlet disposed in the body above the liquid chemical to provide a carrier gas to the inner volume such that the carrier gas is capable of interacting with a precursor derived from the liquid chemical in the inner volume;
an outlet disposed in the body above the liquid chemical to flow the carrier gas and at least a portion of the precursor from the inner volume;
an inlet tube fluidly coupled to the inner volume to provide the liquid chemical to the inner volume, the inlet tube passing through an upper portion of the inner volume and extending to the reduced volume portion;
a liquid input valve coupled to the inlet tube to control opening and closing of the inlet tube to control delivery of the liquid chemical; and
a level sensor configured to sense a level of the liquid chemical in the reduced volume portion, wherein the level sensor is coupled to a controller which outputs signals to control the liquid input valve based on a detected liquid chemical level.

9. The liquid chemical delivery apparatus of claim 8, wherein the reduced volume portion is centered within the body.

10. The liquid chemical delivery apparatus of claim 8, wherein the reduced volume portion is offset to a side of the body.

11. The liquid chemical delivery apparatus of claim 8, wherein the inlet tube has an end disposed in the reduced volume portion above the bottom.

12. The liquid chemical delivery apparatus of claim 8, wherein the reduced volume portion is defined by a wall which linearly tapers from a vertically oriented portion of an upper portion of the inner volume to a planar bottom of the inner volume.

13. The liquid chemical delivery apparatus of claim 8, wherein the level sensor is disposed in the reduced volume portion.

14. A method of delivering a liquid chemical to a process chamber, comprising:
providing a liquid chemical to a body of a liquid chemical delivery apparatus, wherein the body includes an inner volume to hold the liquid chemical, and wherein the inner volume includes a reduced volume portion disposed at a bottom of the inner volume, wherein the reduced volume portion is defined by a wall which linearly tapers from a vertically oriented portion of an upper portion of the inner volume to a planar bottom of the inner volume, and wherein an inlet tube fluidly couples to the inner volume to provide the liquid chemical to the inner volume, the inlet tube passing through an upper portion of the inner volume and extending to the reduced volume portion;
flowing a carrier gas from an inlet disposed in the body above the liquid chemical and through the inner volume to create a mixture of the carrier gas and a vapor of the liquid chemical flowing the mixture of the carrier gas and the vapor of the liquid chemical from the inner volume to an outlet disposed in the body above the liquid chemical; and
sensing a level of the liquid chemical in the reduced volume portion using a level sensor to detect a low level of the liquid chemical and outputting signals to control a liquid input valve based on a detected liquid chemical level.

15. The method of claim 14, further comprising:
refilling the inner volume with the liquid chemical when the low level of the liquid chemical is detected.

16. The method of claim 14, further comprising:
flowing the mixture of the carrier gas and the vapor of the liquid chemical through an outlet fluidly coupled to an upper portion of the inner volume.

* * * * *